(12) United States Patent
Lin et al.

(10) Patent No.: US 8,013,355 B2
(45) Date of Patent: Sep. 6, 2011

(54) HIGH POWER LIGHT EMITTING DIODE

(75) Inventors: Chun-Cheng Lin, Chiayi (TW); Abram Chang, Taipei (TW); Sheng-Jia Sheu, Banciao (TW); Eddie Huang, Jhonghe (TW)

(73) Assignee: Everlight Electronics Co., Ltd., Tu Chen (TW)

( * ) Notice: Subject to any disclaimer, the term of this patent is extended or adjusted under 35 U.S.C. 154(b) by 43 days.

(21) Appl. No.: 11/939,552

(22) Filed: Nov. 13, 2007

(65) Prior Publication Data

US 2009/0032822 A1     Feb. 5, 2009

(30) Foreign Application Priority Data

Jul. 30, 2007   (TW) ................................ 96212458 U

(51) Int. Cl.
  *H01L 33/00* (2010.01)
  *H01L 31/0203* (2006.01)
  *H01L 31/0232* (2006.01)
(52) U.S. Cl. .......... 257/99; 257/431; 257/432; 257/433; 257/706; 257/713; 257/79; 257/100; 257/701; 257/702; 257/712; 257/E33.075
(58) Field of Classification Search .................... 257/79, 257/99, 712, E33.075, 100, 431–433, 701, 257/702, 706, 713
See application file for complete search history.

(56) References Cited

U.S. PATENT DOCUMENTS

2008/0079019 A1 * 4/2008 Huang et al. .................... 257/99
* cited by examiner

*Primary Examiner* — Lynne Gurley
*Assistant Examiner* — Naima Kearney
(74) *Attorney, Agent, or Firm* — Chen Yoshimura LLP

(57) ABSTRACT

A high power light emitting diode, The high power light emitting diode comprises a light emitting diode chip, a main module, two first electrode pins, two second electrode pins, and at least one heat dissipation board. The main module has a concave and the light emitting diode chip is positioned in the concave. The first electrode pins are connected to a first side of the main module and also electrically connected to the light emitting diode chip. The second electrode pins are arranged on a second side of the main module that is relative to the first electrode pins wherein the second electrode pins and the first electrode pins are electrically opposite. The second electrode pins are electrically connected to the light emitting diode chip. The heat dissipation board is connected to a part of the main module between the first electrode pin and the second electrode pin.

17 Claims, 1 Drawing Sheet

HIGH POWER LIGHT EMITTING DIODE

RELATED APPLICATIONS

This application claims priority to Taiwan Application Serial Number 96212458, filed Jul. 30, 2007, which is herein incorporated by reference.

BACKGROUND

1. Field of Invention

The present invention relates to a high power light emitting diode. More particularly, the present invention relates to a heat dissipation structure for a high power light emitting diode.

2. Description of Related Art

Light emitting Diode (LED) is a type of compound semiconductor which releases energy by combining holes and electrons in P-type and N-type semiconductor materials. LED has been utilized in variety of optical display apparatuses because of its small volume, long lifetime, low power consumption, and quick response.

Due to progressing expitaxy technology and different needs in the market, high power LED has been developed recently. High power LED is a LED which consumes power more than 1 watt. Compared to traditional LED, high power LED has higher energy conversion efficiency.

The method of fabricating high power LED nowadays comprises inserting a lead frame into a print circuit board and then soldering the lead frame on the print circuit board. However, the heat conductivity of print circuit board is poor, and the contact area between the lead frame and the LED is small, so the heat dissipation efficiency is limited. After LED is used for a long period of time, heat can not be dissipated by lead frames or the print circuit board which results in decrease of LEC luminous efficiency.

For the forgoing reasons, there is a need for improving high power LEDs structure to enhance heat dissipation efficiency and lower the operating temperature of LED to improve luminous efficiency.

SUMMARY

The present invention is directed to provide a high power light emitting diode to enhance heat dissipation efficiency while operating LEDs.

It is therefore an objective of the present invention to provide a high power light emitting diode. The high power light emitting diode comprises a light emitting diode chip, a main module, two first electrode pins, two second electrode pins, and at least one heat dissipation board. The main module has a concave and the light emitting diode chip is positioned in the concave. The first electrode pins are connected to a first side of the main module and also electrically connected to the light emitting diode chip. The second electrode pins are arranged on a second side of the main module that is relative to the first electrode pins wherein the second electrode pins and the first electrode pins are electrically opposite. The second electrode pins are electrically connected to the light emitting diode chip. The heat dissipation board is connected to a part of the main module between the first electrode pin and the second electrode pin.

In accordance with one embodiment of the present invention, the first electrode pins and the second electrode pins are face to face in pairs. Moreover, the heat dissipation board is L-shaped and is integrated with the main module. The heat dissipation is made of a metal. The metal is selected from a group consisting of silver, aluminum, copper and a combination thereof.

In the foregoing, the heat dissipation board can enlarge the area for dissipating heat. Moreover, the heat sink compound can be used on the heat dissipation board so that heat can be conducted from the heat dissipation board to the print circuit board more easily. In addition, the structure of the heat dissipation board helps the high power light emitting diode be positioned on the print circuit board. This can reduce the probability for high power light emitting diode to be accidentally detached from the print circuit board.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
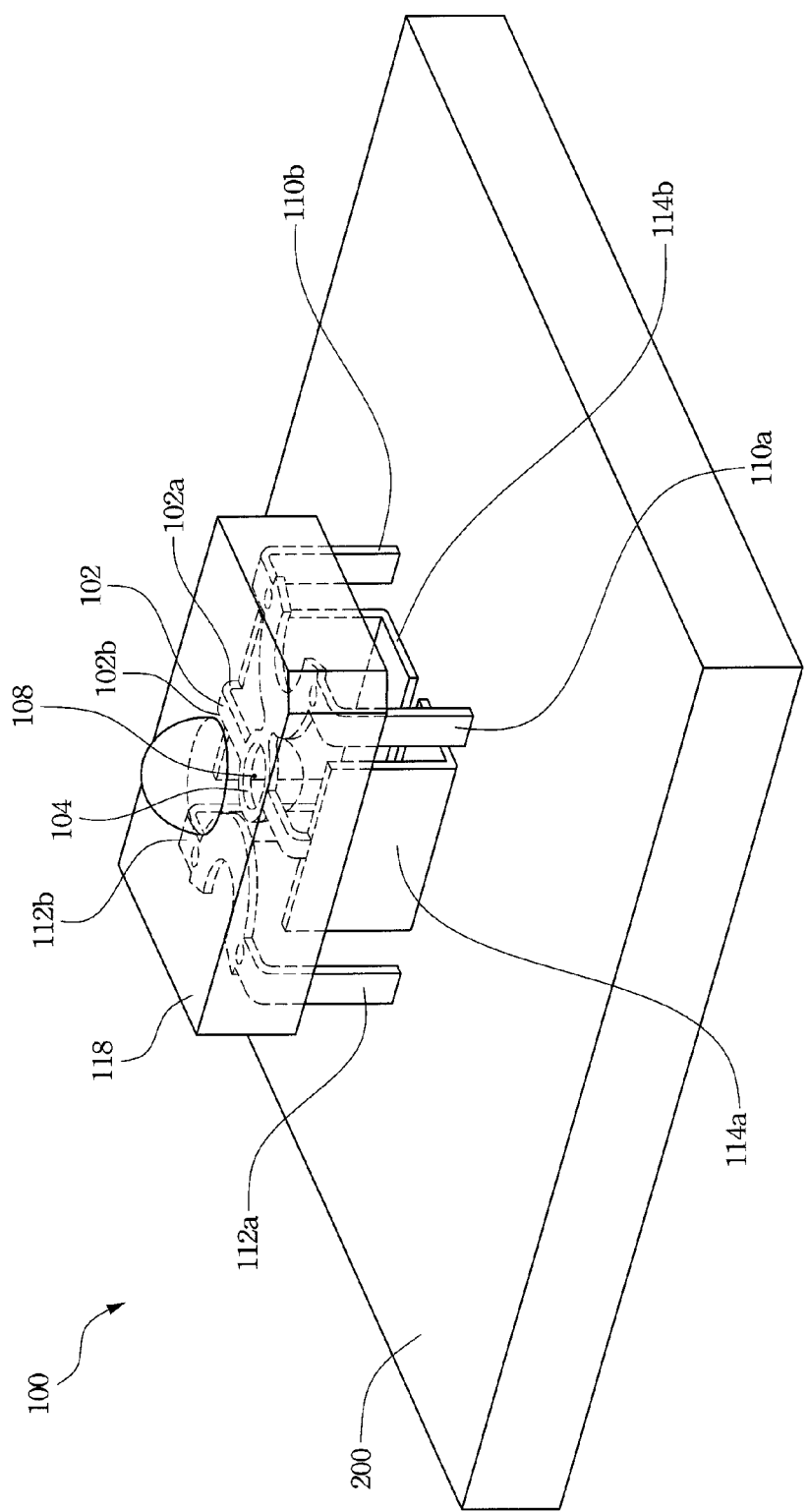
FIG. 1 illustrates a high power LED according to one embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, it illustrates a high power LED according to one preferred embodiment of this invention. There are various types of high power LEDs. In FIG. 1, a Superflux high power LED 100 was illustrated. The Superflux high power LED 100 comprised a light emitting diode chip 108, a main module 102, two first electrode pins 110a and 110b, two second electrode pins 112a and 112b, and two heat dissipation boards 114a and 114b. There was a concave 104 arranged in the center of the main module 102 and the light emitting diode chip 108 was positioned in the concave 104. Moreover, the first electrode pins 110a and 110b were connected to one first side 102a of the main module 102. The first electrode pins 110a and 110b were also electrically connected to the light emitting diode chip 108 so that the light emitting diode chip 108 was further electrically connected to the print circuit board 200. In addition, since the second electrode pins 112a and 112b and the first electrode pins 110a and 110b were electrically opposite, so the second electrode pins 112a and 112b were arranged on the second side 102b of the main module 102 that was relative to the first electrode pins 110a and 110b with a predetermined distance to prevent short circuit. Furthermore, the second electrode pins 112a and 112b were also electrically connected to the light emitting diode chip 108 so that the light emitting diode chip 108 was connected to the board 200 to become a circuit.

To enhance heat dissipation efficiency of the high power LED 100, the heat dissipation boards 114a and 114b were connected to a part of the main module 102 between the first electrode pin 110a and the second electrode pin 112a, and between the first electrode pin 110b and the second electrode pin 112b, respectively. Moreover, to enlarge the area of the heat dissipation board 114a and 114b, the shape of the heat dissipation board 114a and 114b can be L-shaped as shown in FIG. 1. In addition to improving heat dissipation efficiency, the L-shaped heat dissipation board 114a and 114b also helped the high power LED 100 be positioned on the print circuit board 200 because the bases of the L-shaped heat dissipation board 114a and 114b were connected to the print circuit board 200. The heat dissipation board 114a and 114b can be made of metals, such as silver, aluminum, or copper, and can be integrated with the main module 102.

In addition, the high power LED 100 further comprises an encompassing component 118 which was arranged on the main module 102 so that the main module 102, a part of the first electrode pins 110a and 110b, a part of the second electrode pins 112a and 112b were enclosed by the encompassing component 118. In addition to providing protection, the encompassing component 118 can also be used as a lens. Therefore, the encompassing component 118 can be made of a transparent resin.

According to above, by arranging a heat dissipation board on the main module, it can improve heat dissipation efficiency substantially. Hence, the light emitting diode chip can have low operating temperature so product life time can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED) package for mounting on a printed circuit board (PCB), the LED package comprising:
    an LED chip;
    a lead frame comprising:
        a main part carrying the LED chip;
        a first electrode pin extending from the main part and coupled to the PCB;
        a second electrode pin spaced from the main part and coupled to the PCB, wherein the LED chip is coupled to the first electrode pin and the second electrode pin; and
        an L-shaped heat dissipation board comprising:
            an upper portion coupled to the main part and extending in a direction perpendicular to an upper surface of the PCB; and
            a bottom portion coupled to the upper portion, the bottom portion having a plate shape which extends in a direction parallel to the upper surface of the PCB and which directly contacts the upper surface of the PCB; and
    an encompassing component enclosing the LED chip, the main part, a portion of the first electrode pin and a portion of the second electrode pin of the lead frame, and exposing the heat dissipation board of the lead frame.

2. The light emitting diode (LED) package of claim 1, wherein the heat dissipation board is disposed between the first electrode pin and the second electrode pin.

3. The light emitting diode (LED) package of claim 1, wherein the encompassing component comprises a lens portion over the LED chip.

4. The light emitting diode (LED) package of claim 1, wherein the main part, the first electrode pin and the heat dissipation board of the lead frame are made in one piece.

5. The light emitting diode (LED) package of claim 1, wherein the main part has a concave thereon in which the LED chip is disposed.

6. A light emitting diode (LED) package for mounting on a printed circuit board (PCB), the LED package comprising:
    a lead frame comprising a first electrode pin, a second electrode pin and an L-shaped heat dissipation board, wherein the heat dissipation board has an upper portion and a bottom portion, wherein the upper portion extends downwardly to the PCB, and the bottom portion, coupled to the upper portion, has a plate shape which extends in a plane parallel to an upper surface of the PCB and directly contacts the upper surface of the PCB;
    an LED chip heat-conductively connected to the heat dissipation board and electrically connected to the first electrode pin and the second electrode pin; and
    an encompassing component enclosing the LED chip, a portion of the first electrode pin and a portion of the second electrode pin of the lead frame, and exposing the heat dissipation board of the lead frame.

7. The light emitting diode (LED) package of claim 6, wherein the heat dissipation board is disposed between the first electrode pin and the second electrode pin.

8. The light emitting diode (LED) package of claim 6, wherein the lead frame further comprises a main part carrying the LED chip and enclosed in the encompassing component, wherein the first electrode pin and the heat dissipation board extend from the main part of the lead frame respectively.

9. The light emitting diode (LED) package of claim 8, wherein the main part, the first electrode pin and the heat dissipation board of the lead frame are made in one piece.

10. The light emitting diode (LED) package of claim 6, wherein the encompassing component comprises a lens portion over the LED chip.

11. The light emitting diode (LED) package of claim 8, wherein the main part has a concave thereon in which the LED chip is disposed.

12. A light emitting diode (LED) package for mounting on a printed circuit board (PCB), the LED package comprising:
    an LED chip;
    a lead frame comprising a first electrode pin, a second electrode pin and an L-shaped heat dissipation board having an vertical portion and a horizontal portion, wherein the LED chip is coupled to the first electrode pin and the second electrode pin and the LED is thermally connected to the L-shaped heat dissipation board, wherein the vertical portion extends downwardly toward the PCB and the horizontal portion, coupled to the vertical portion, has a plate shape which extends in a plane parallel to an upper surface of the PCB and directly contacts the upper surface of the PCB; and
    an encompassing component enclosing the LED chip, a portion of the first electrode pin and a portion of the second electrode pin of the lead frame, and exposing the L-shaped heat dissipation board of the lead frame.

13. The light emitting diode (LED) package of claim 12, wherein the head dissipation board is disposed between the first electrode pin and the second electrode pin.

14. The light emitting diode (LED) package of claim 12, wherein the lead frame further comprises a main part carrying the LED chip and enclosed in the encompassing component, wherein the first electrode pin and the L-shaped heat dissipation board extend from the main part of the lead frame respectively.

15. The light emitting diode (LED) package of claim 14, wherein the main part, the first electrode pin and the L-shaped heat dissipation board of the lead frame are made in one piece.

16. The light emitting diode (LED) package of claim 14, wherein the main part has a concave thereon in which the LED chip is disposed.

17. The light emitting diode (LED) package of claim 12, wherein the encompassing component comprises a lens portion over the LED chip.

* * * * *